(12) United States Patent
Liaw

(10) Patent No.: US 7,403,413 B2
(45) Date of Patent: Jul. 22, 2008

(54) MULTIPLE PORT RESISTIVE MEMORY CELL

(75) Inventor: Jhon Jhy Liaw, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 11/427,253

(22) Filed: Jun. 28, 2006

(65) Prior Publication Data

US 2008/0002453 A1    Jan. 3, 2008

(51) Int. Cl.
*G11C 11/14* (2006.01)
*G11C 8/16* (2006.01)

(52) U.S. Cl. .................. 365/158; 365/230.05; 365/171; 365/189.04; 365/148

(58) Field of Classification Search ............ 365/230.05, 365/189.04, 158, 171, 173, 163, 148; 711/149
See application file for complete search history.

(56) References Cited

U.S. PATENT DOCUMENTS

| 5,923,593 | A |  | 7/1999 | Hsu et al. |
| 6,456,524 | B1 | * | 9/2002 | Perner et al. ................. 365/158 |
| 6,609,174 | B1 | * | 8/2003 | Naji ........................... 711/104 |
| 2003/0223283 | A1 | * | 12/2003 | Kunikiyo ..................... 365/200 |

* cited by examiner

*Primary Examiner*—J. H. Hur
(74) *Attorney, Agent, or Firm*—Baker & McKenzie LLP

(57) ABSTRACT

A resistive type memory system provides improved read access with multiple ports. The resistive type memory system includes a plurality of resistive type memory cells arranged in an array. Each of the resistive type memory cells has a corresponding first port and a corresponding second port. Each first port enables both read access and write access to the corresponding resistive type memory cell. Additionally, each second port enables read access to the corresponding MRAM cell. Furthermore, the memory system enables overlapping read or write access, with another read access.

15 Claims, 10 Drawing Sheets

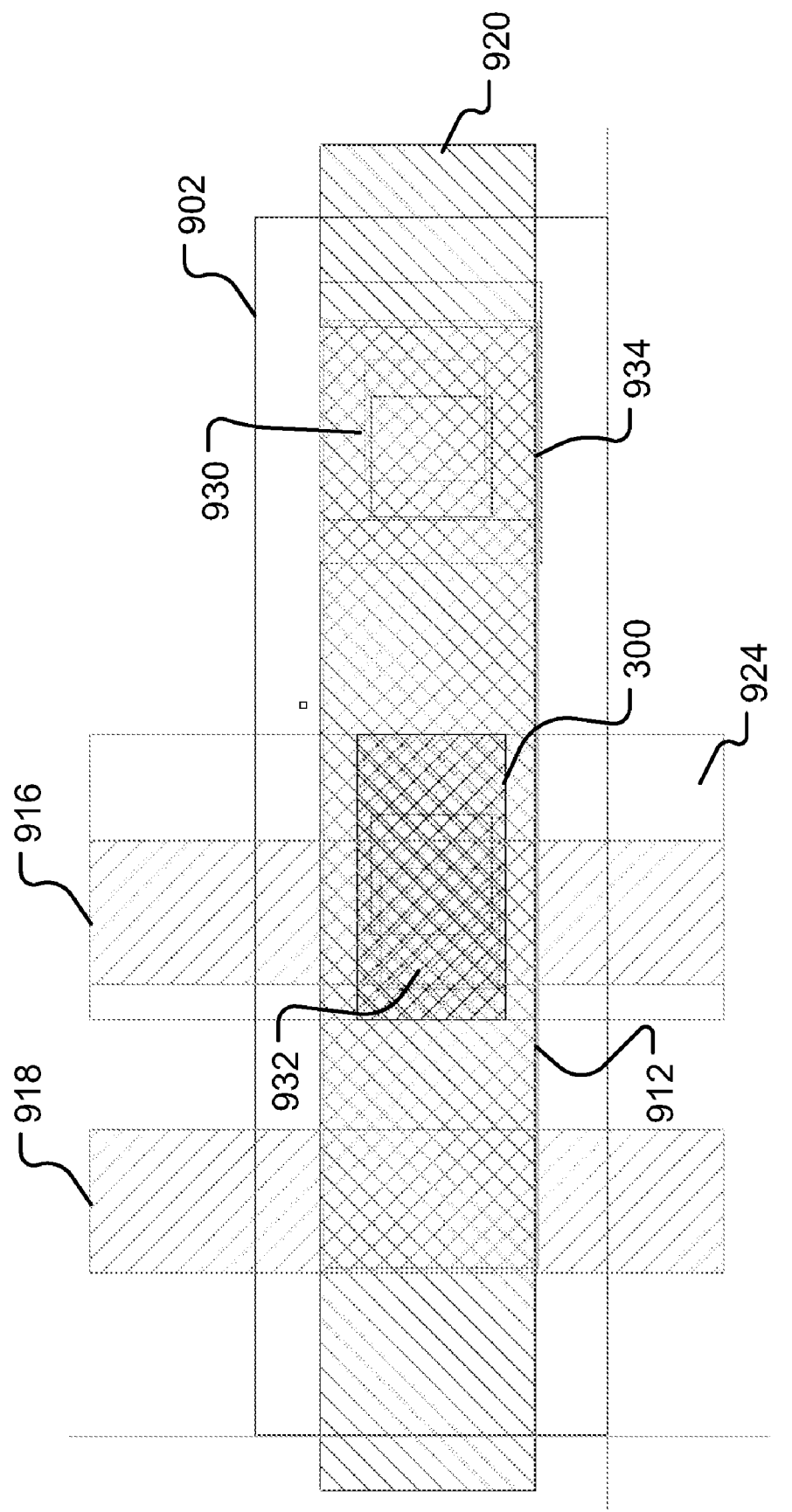

MULTIPLE PORT RESISTIVE MEMORY CELL

TECHNICAL FIELD

Disclosed embodiments herein relate generally to nonvolatile memory, and more particularly to multiple port resistive type memory cells, resistive type memory arrays with multiple ports, and a system using the same.

BACKGROUND

Resistive type memory has "0" and "1" logic states that are determined by a resistance difference of the memory rather than conventional charges stored in capacitors. Currently, there are several known resistive type memories: for example, magnetoresistive random access memory (MRAM) and phase change random access memory (PRAM). More recently, memory cells formed by nanotubes also provide a resist type of memory. MRAM is a type of non-volatile memory that uses magnetism rather than charge stored in capacitors to store data (e.g., both DRAM and FRAM are capacitor-type memories). Conventional MRAM cells are described in U.S. patent application Ser. No. 10/907,977, entitled "Magnetic Random Access Memory Device," by Jhon Jhy Liaw, and are herein incorporated by reference.

Conventional resistive memory cells have several limitations. One limitation is that of speed in reading data from the cells. Currently, logic circuits are operating at frequencies in the GHz ranges. However, conventional resistive memory cell devices are constrained to operate at much slower rates, causing a significant performance gap between the logic and the memory. This performance gap results in a suboptimal performance of the logic circuits because supporting resistive memory devices cannot provide data and instructions fast enough. Thus, this results in a bottleneck effect at the resistive memory devices, particularly in System on Chip (SoC) designs, which combine memory with logic circuitry on a chip. It would therefore be desirable to improve the speed of data access in resistive memory devices.

SUMMARY

Disclosed herein is a resistive type memory that provides improved read access with multiple ports. In an embodiment, a memory system provides a plurality of resistive type memory cells arranged in an array. In the memory system, each of the resistive type cells has a corresponding first port and a corresponding second port. Additionally, each first port enables both read access and write access to the corresponding resistive type memory cell, and each second port enables read access to the corresponding resistive type memory cell. Further, the memory system enables overlapping read or write access, with another read access. In some embodiments, the resistive type memory cell is a magnetoresistive random access memory (MRAM), although it may alternatively be a phase change random access memory (PRAM), a memory cell formed by nanotubes, or the like.

In another aspect, a non-volatile memory cell includes a resistive type memory element having an electrode layer, a plurality of transistors with each transistor having a gate node connected to the electrode layer, and a reference transistor having a drain node and a source node, where one of the drain and the source nodes of the reference transistor is connected to the electrode layer. Each of the plurality of transistors provides a corresponding port to read data from the non-volatile memory cell.

In yet another aspect, a non-volatile memory cell includes a resistive type memory element having a first electrode conductor, a second electrode conductor, and a resistive memory device between the first and second electrode conductors. A first conductive line is electrically connected to the first electrode conductor. First and second transistors are provided, with each transistor having a gate node, a source node, and a drain node, in which the gate nodes of each transistor are electrically connected to the second electrode conductor. The non-volatile memory cell further includes a second conductive line and a third conductive line, in which the second conductive line is electrically connected to one of the drain node and the source node of the first transistor, and in which the third conductive line is electrically connected to one of the drain node and the source node of the second transistor.

BRIEF DESCRIPTION OF THE DRAWINGS

For a more complete understanding of the principles disclosure herein, and the advantages thereof, reference is now made to the following descriptions taken in conjunction with the accompanying drawings, in which:

FIGS. 9A and 9B show layout diagrams of an exemplary MRAM cell in accordance with the present disclosure.

DETAILED DESCRIPTION

A resistive type memory cell provides improved read access with multiple ports. In an embodiment, a memory system provides a plurality of MRAM cells arranged in an array. In the memory system, each of the MRAM cells has a corresponding first port and a corresponding second port. Additionally, each first port enables both read access and write access to the corresponding MRAM cell, and each second port enables read access to the corresponding MRAM cell. Further, the memory system enables overlapping read or write access, with another read access.

Figure 1:
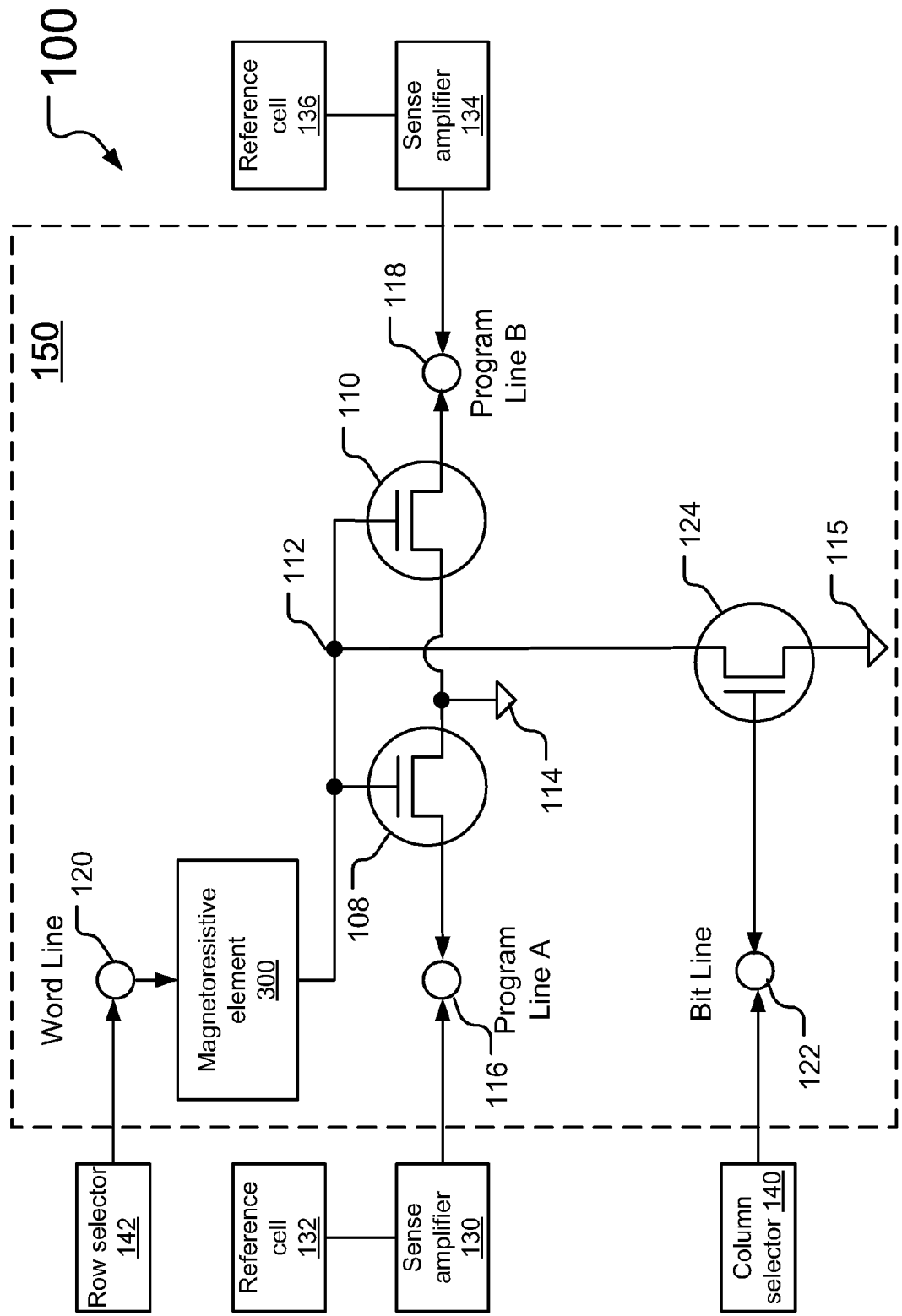
FIG. 1 shows a schematic diagram of an exemplary MRAM cell in accordance with the present disclosure.

FIG. 1 shows a schematic diagram of a portion 100 of an MRAM array, which includes a memory cell 150. The memory cell 150 includes a magnetoresistive (MR) element 300, a reference transistor 124, a first amplifying transistor 108, and a second amplifying transistor 110. The MR element 300 can include layers 302-312 shown in FIG. 3 and described below. It should be noted that the MR element 300 may alternatively be another resistive type memory cell type such as a phase-change random access memory (PRAM) cell, memory cells formed by nanotubes, or the like.

The reference transistor 124 has a gate node coupled to a bit line (BL) 122, a source node coupled to either a predetermined voltage $V_{DD}$ or a signal ground $V_{SS}$ at 115 (depending on which of the read schemes described below is used), and a drain node coupled to the bottom electrode (312 in FIG. 3) of the MR element 300.

The first amplifying transistor 108 has a gate node connected to the drain node of the reference transistor 124 and to the bottom electrode (312 in FIG. 3) of the MR element 300, all of which are electrically connected to node 112. The first amplifying transistor 108 also has a drain node connected to a first program line (PL-A) 116 and a source node connected to $V_{SS}$ at 114. Similarly, the second amplifying transistor 110 has a gate node connected to the drain node of the reference transistor 124 and to the bottom electrode 312 of the MR element 300. The second amplifying transistor 110 also has a drain node connected to a second program line (PL-B) 118 and a source node connected to $V_{SS}$ at 114.

The top electrode (302 in FIG. 3) of the MR element 300 is coupled to a word line (WL) 120. The first program line (PL-A) 116 extends in the vicinity of the MR element 300 for write operations.

Components of the MRAM array 100 external to the memory cell 150 include a first sense amplifier 130 connected to the PL-A 116, and a second sense amplifier 134 connected to the PL-B 118. During a read operation, the first sense amplifier 130 and/or the second sense amplifier 134 can determine the logic state of the memory cell 150 based on whether the voltage (or current) on the PL-A 116 and PL-B 118 is higher or lower than a reference voltage (or current). In some embodiments, the reference voltage (or current) can come from optional reference cells 132 and 136 connected to the sense amplifiers 130 and 134, respectively. The reference cells 132 and 136 can include an MR element fixed at a midpoint resistance level. In other embodiments, a fixed voltage (or current) can be supplied to the sense amplifiers 130 and 134 for use as a reference voltage (or reference current).

The MRAM array 100 can further include a column selector 140 and a row selector 142. The column and row selectors 140, 142 are used for addressing cells of the MRAM array. For this purpose, the column selector 140 controls the voltage level of the BL 122 and the row selector controls the voltage level of the WL 120.

Figure 2:
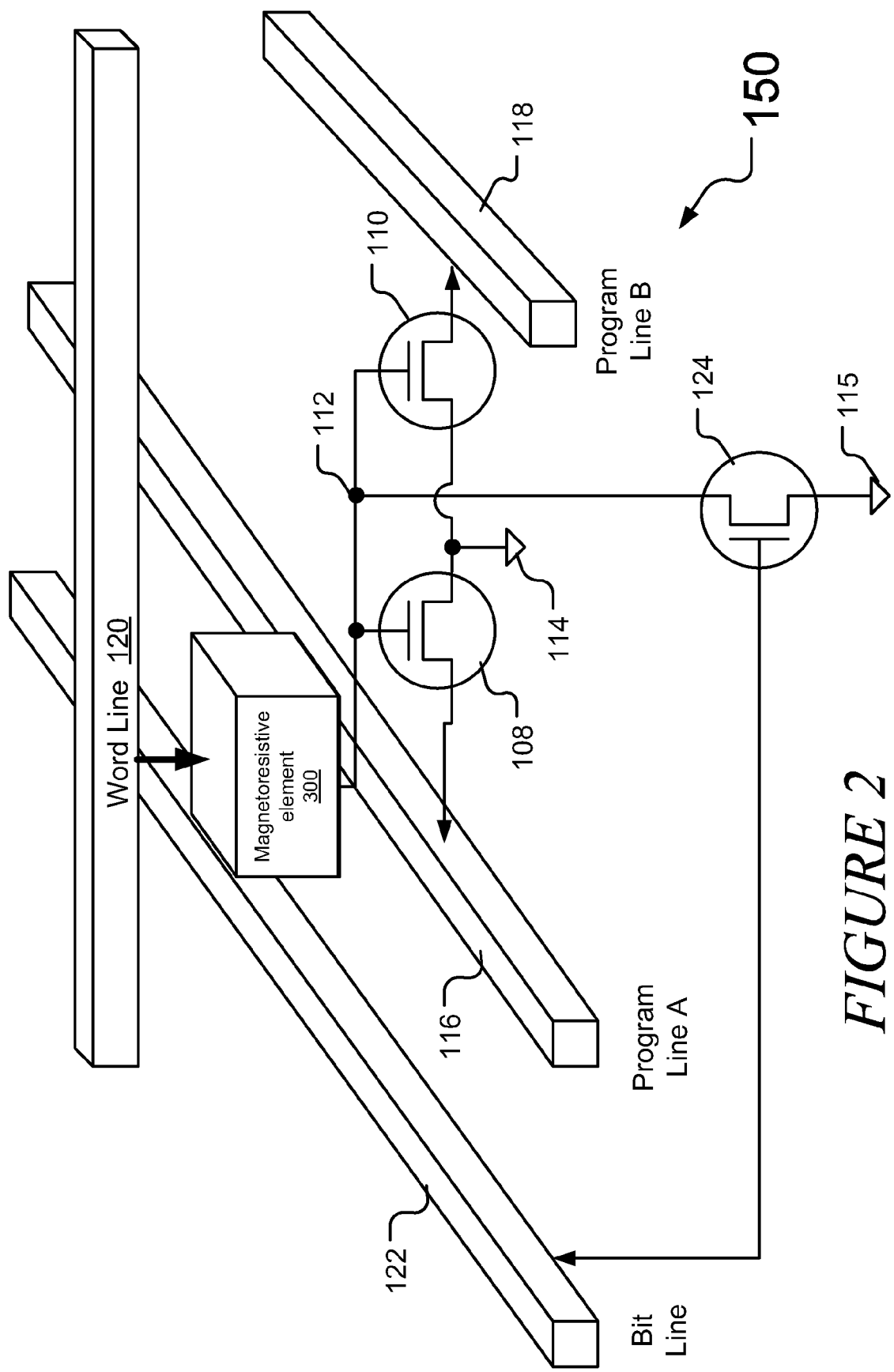
FIG. 2 shows a perspective diagram of the MRAM cell of FIG. 1.

FIG. 2 shows a perspective diagram of the exemplary MRAM cell 150 of FIG. 1. Word line (WL) 120 provides a first conductive line electrically connected to the top electrode (302 of FIG. 3) of magnetoresistive element 300. First and second program lines PL-A 116 & PL-B 118 provide conductive lines extending substantially orthogonal to WL 120. Bit line (BL) 122 provides a conductive line, extending substantially parallel to PL-A 116 and PL-B 118. The cells 150 may be arranged in an array as depicted in the plan view of FIG. 5. Although PL-A 116 and PL-B 118 are shown at the same level of conductive layer, it should be appreciated that bit line 122, PL-A 116 and PL-B 118 may alternatively be formed at different levels of conductive layers for cell size optimization. Furthermore, the width of PL-A 116 may be substantially the same as the width of magnetoresistive element 300, and wider than the width of PL-B 118 for cell size optimization for read/write current optimization. Additionally, PL-A 116, PL-B 118 and WL 120 may intersect at an acute angle depending on cell design.

During a write operation, electrical current flows through PL-A 116 and a current is passed through WL 120. The magnitude of these currents is selected such that, ideally, the resulting magnetic fields are not strong enough to affect the memory state of other proximate MR elements in the array, yet the combination of the two magnetic fields (at MR element 300) is sufficient for switching the memory state of MR element 300 (e.g., switching the magnetic moment of the free layer 304 shown in FIG. 3).

Figure 8:
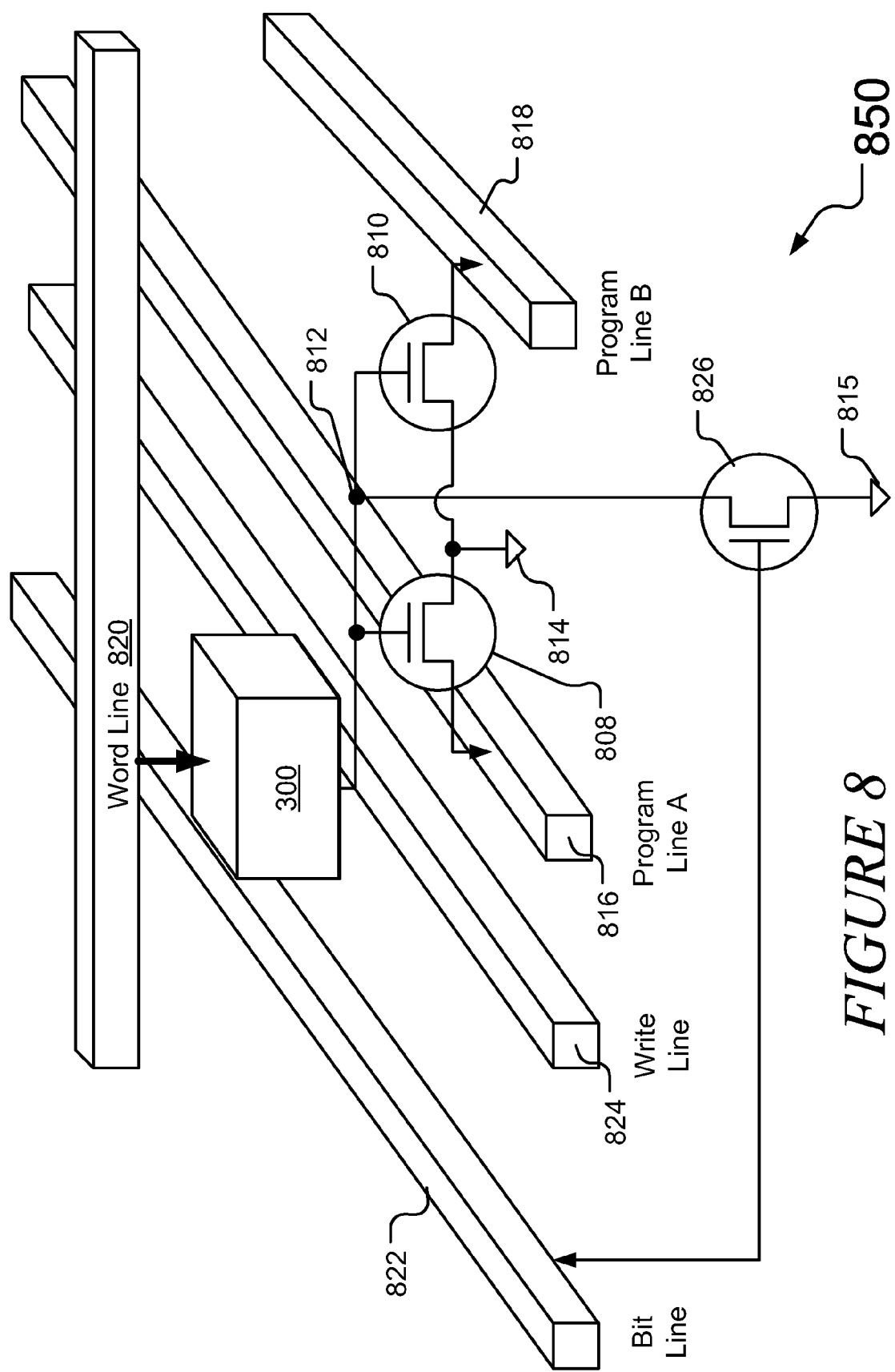
FIG. 8 shows a perspective diagram of an alternative embodiment of an exemplary MRAM cell in accordance with the present disclosure.

In another embodiment, described in more detail in FIG. 8, a dedicated write line may be used. For example, a write operation may be performed by passing electrical current through a bit write line (824 of FIG. 8), that extends in the same or different direction as program lines PL-A 116 & PL-B 118. Such a bit write line is proximate to the bottom electrode (312 of FIG. 3).

In yet another embodiment, a write operation may be performed by passing electrical current through PL-A 116 as a bit write line, that extends in the same or different direction as program lines PL-B 118. Such a bit write line is proximate to the bottom electrode (312 of FIG. 3). Accordingly, the first port conductive line can perform a dual function for write and read operations.

Figure 3:
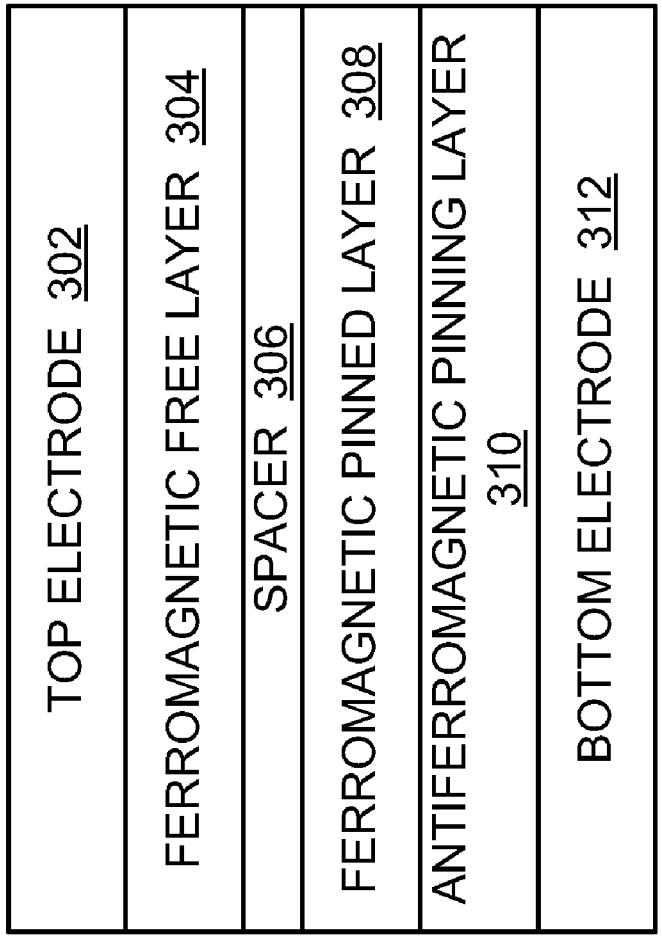
FIG. 3 shows a schematic block diagram of a typical magnetic tunneling junction structure.

FIG. 3 shows an example of a typical magnetoresistive element 300. The magnetoresistive element 300 includes the following layers: a top electrode layer 302, a ferromagnetic free layer 304, a spacer 306 which serves as a tunneling barrier, a ferromagnetic pinned layer 308, an antiferromagnetic pinning layer 310, and a bottom electrode 312. The ferromagnetic free layer 304 and the ferromagnetic pinned layer 308 are constructed of ferromagnetic material, for example cobalt-iron or nickel-cobalt-iron. The antiferromagnetic pinning layer 310 is constructed of antiferromagnetic material, for example platinum manganese. Magnetostatic coupling between the ferromagnetic pinned layer 308 and the antiferromagnetic pinning layer 310 causes the ferromagnetic pinned layer 308 to have a fixed magnetic moment. The ferromagnetic free layer 304, on the other hand, has a magnetic moment that, by application of a magnetic field, can be switched between a first orientation, which is parallel to the magnetic moment of the ferromagnetic pinned layer 308, and a second orientation, which is antiparallel to the magnetic moment of the ferromagnetic pinned layer 308.

The spacer 306 interposes the ferromagnetic pinned layer 308 and the ferromagnetic free layer 304. The spacer 306 is composed of insulating material, for example aluminum oxide, magnesium oxide, or tantalum oxide. The spacer 306 is formed thin enough to allow the transfer (tunneling) of spin-aligned electrons when the magnetic moments of the ferromagnetic free layer 304 and the ferromagnetic pinned layer 308 are parallel. On the other hand, when the magnetic moments of the ferromagnetic free layer 304 and the ferromagnetic pinned layer 308 are antiparallel, the probability of electrons tunneling through the spacer 306 is reduced. This phenomenon is commonly referred to as spin-dependent tunneling (SDT).

Figure 4:
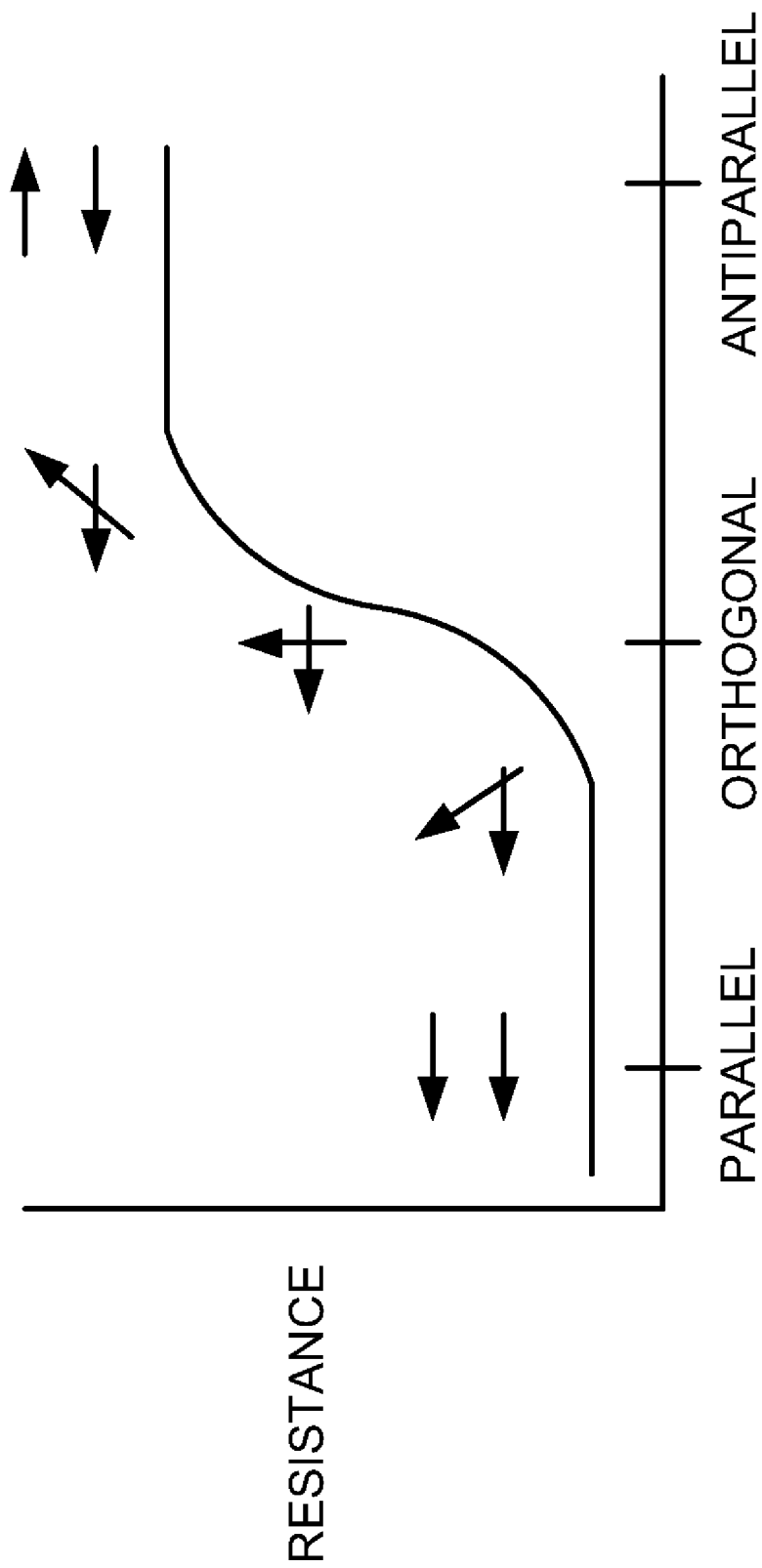
FIG. 4 shows a graph of the relationship between resistance and the relative magnetic orientations of the free and pinned layers in the magnetoresistive element shown in FIG. 3.

As shown in FIG. 4, the electrical resistance through the magnetoresistive element 300 (e.g., through layers 302-312) increases as the moments of the pinned and free layers become more antiparallel and decreases as they become more parallel. In an MRAM memory cell, the electrical resistance of the magnetoresistive element 300 can therefore be switched between first and second resistance values representing first and second logic states. For example, a high resistance value can represent a logic state "1" and a low resistance value can represent a logic state "0". The logic states thus stored in the memory cells can be read by passing a sense current through the MR element and sensing the resistance.

As mentioned above, there are multiple options for read schemes for the portion 100 of the MRAM array shown in FIG. 1.

A first read scheme can be used when the reference transistor 124 has its source node connected to signal ground $V_{SS}$ (e.g., where $V_{SS}$ is signal ground). In order to read the data bit stored in the MR element 300, the column selector 140 sets the BL 122 to a predetermined voltage, for example, a voltage in a range of 0.3V to 1.8V. The row selector 142 sets the WL 120 to a predetermined voltage, for example, a voltage in a range of 0.3V to 1.5V. The voltage $V_{IN}$ at input node 112 will depend on the resistance of the MR element 300 as follows:

$$V_{IN} = V_{BL} \frac{R_{REF}}{R_{REF} + R_{MR}} \quad (1)$$

where $R_{REF}$ is the resistance across the reference transistor 124 and $R_{MR}$ is the resistance across the MR element 300. The current or voltage level of the PL-A 116 and PL-B 118 can then be detected by the sense amplifiers 130 and 134 respectively, in order to detect the logic state stored in the memory cell 150. In embodiments that include a reference cell 132, for example, the sense amplifier 130 can detect the logic state of the memory cell 150 based on a comparison of the voltage (or current) level of the PL-A 116 to a reference voltage (or current) level received from the reference cell 132. Similarly, the sense amplifier 134 can detect the logic state of the memory cell 150 based on a comparison of the voltage (or current) level of the PL-B 118 to a reference voltage (or current) level received from the reference cell 136.

Alternatively, the polarity across the reference transistor 124 and the MR element 300 can be reversed. Specifically, a second read scheme can have the WL 120 set to signal ground $V_{SS}$ and the source node of the reference transistor 124 connected to a predetermined voltage $V_{DD}$, for example, a voltage in a range of 0.3V to 1.5V. The BL 122 is still set to a predetermined voltage, for example, a voltage in a range of 0.3V to 1.8V, in order to read the data bit stored in the MR element 300. In order to read the data from PL-A 116, a predetermined voltage level $V_{DD}$, for example, a voltage in a range of 0.3V to 1.8V, is applied to the PL-A 116. As in the first read scheme, the voltage $V_{IN}$ at node 112 will depend on the resistance of the MR element 300 according to Equation (1) above. The current or voltage level of the PL-A 116 can then be detected by the sense amplifier 130 in order to detect the logic state stored in the memory cell 150. In embodiments that include a reference cell 132, for example, the sense amplifier 130 can detect the logic state of the memory cell 150 based on a comparison of the voltage (or current) level of the PL-A 116 to a reference voltage (or current) level received from the reference cell 132. Similarly, in order to read the data from PL-B 118, a predetermined voltage level of $V_{DD}$, for example, a voltage in a range of 0.3V to 1.8V, is applied to the PL-B 118. Sense amplifier 134 may detect the logic state of the memory cell 150 by comparison of the voltage (or current) on PL-B 118 with a reference voltage (or current) level received from the reference cell 136.

As a result of including the amplifying transistors 108 and 110 in the memory cell 150 and using a read operation such as those described above, the logic state can be sensed by detecting current on the program lines 116 and/or 118, which varies according to the voltage at the input node 112. In this case, if the MR ratio is 30% and the resistance $R_{REF}$ across the reference transistor 124 is close to the resistance $R_{MR}$ across the MR element 300, then the difference between the current on a program line $I_{PL}$ (PL-A 116 and PL-B 118), for example, $I_{PL}$ "High" (e.g., representative of a logic state "0") and $I_{PL}$ "Low" (e.g., representative of a logic state "1") can provide for a read margin in a range of 50% to 200%.

The increased read margin is advantageous for embodiments that include reference cells 132 & 136. In such embodiments, a read operation depends on the ability of the sense amplifier 130 to accurately determine a logic state based on whether the voltage from the memory cell 150 is higher or lower than the reference voltage received from the reference cell 132. However, in a large array of memory cells 150, slight differences between MR elements 104 can result in variations among the read voltages received from different memory cells 150. If the read margin is too low, as in prior devices, such deviations in read voltages can result in false readings. On the other hand, by increasing the read margin according to the present application, the impact of differences among the MR elements 104 is greatly reduced if not eliminated. As a result, a more reliable memory device can be realized.

Figure 5:
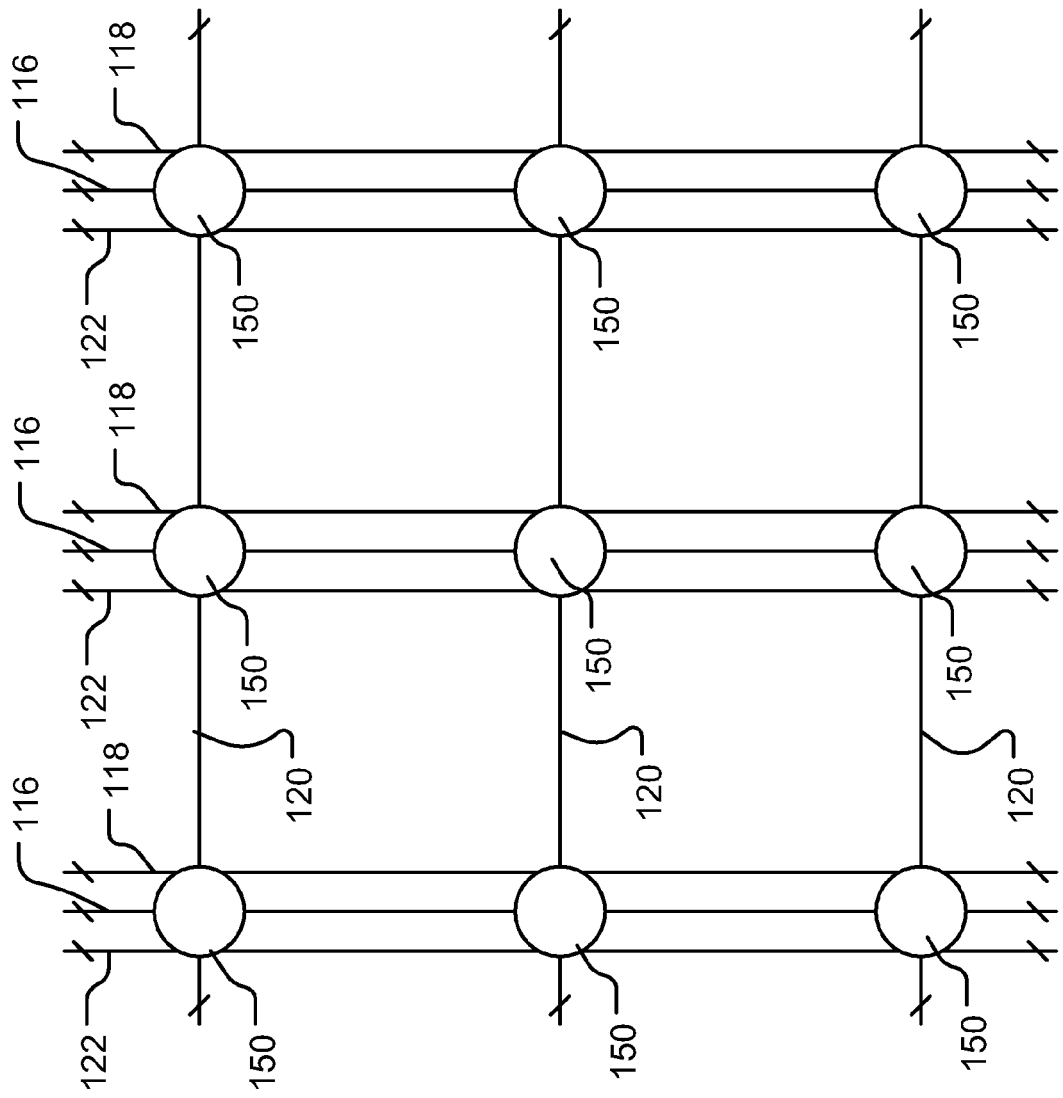
FIG. 5 shows a simplified plan view of a memory array including memory cells such as the one shown in FIG. 1.

FIG. 5 shows a simplified plan view of an exemplary layout according to the disclosed principles of an MRAM array composed of memory cells 150. The memory cells 150 are arranged in rows and columns. Each memory cell 150 of a particular row is connected by a word line 120, while each memory cell 150 of a particular column is connected by a bit line 122, a first program line 116 and a second program line 118.

Figure 6:
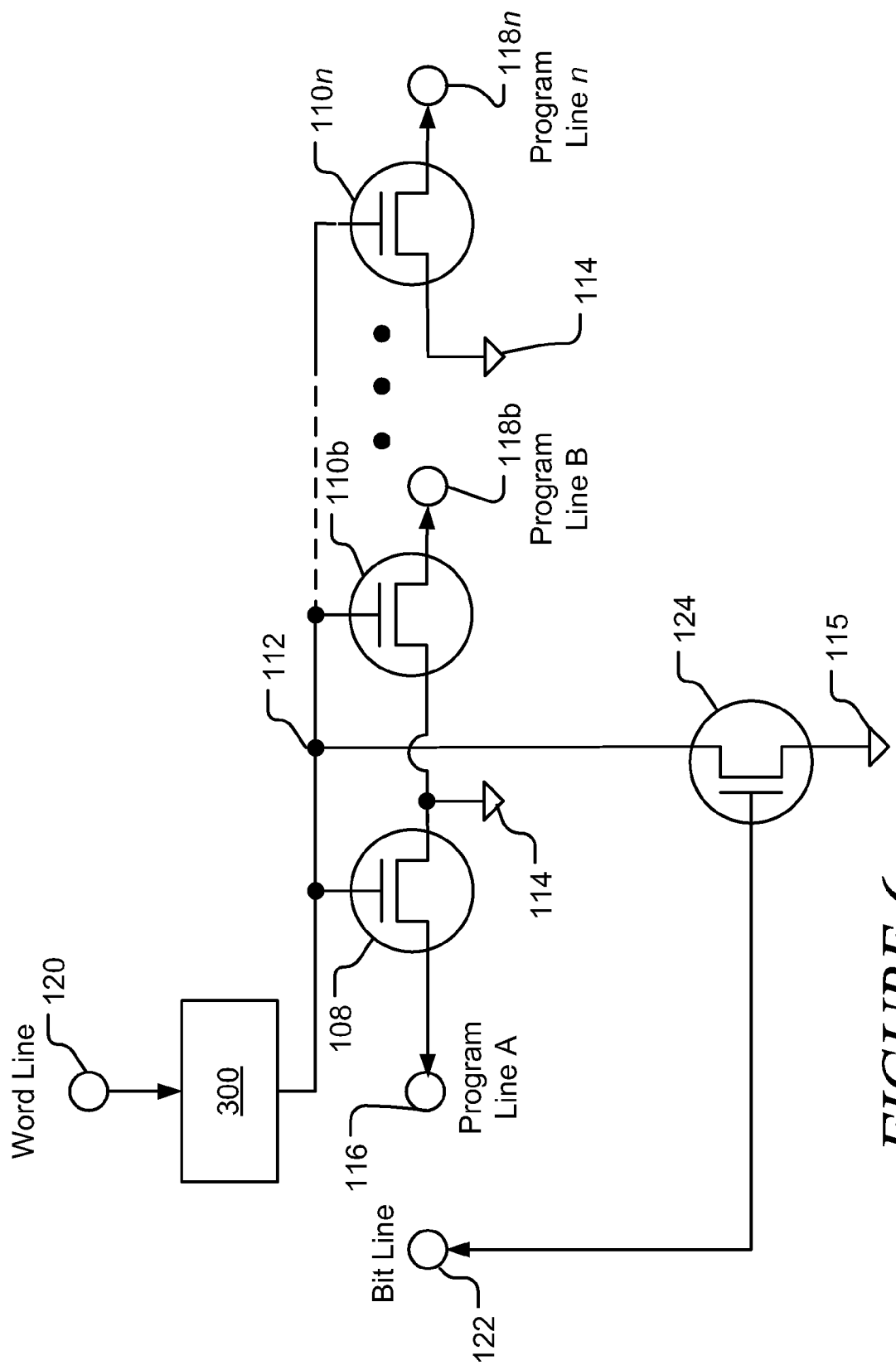
FIG. 6 shows a schematic diagram of an exemplary MRAM memory cell with additional program lines.

FIG. 6 shows a schematic diagram of an exemplary MRAM memory cell with additional program lines. Additional amplifying transistors from 110b to 110n may have their respective gates connected to node 112, where n−2 represents an integer number of amplifying transistors in the cell 150. The amplifying transistors 110b to 110n have a source node connected to $V_{SS}$ at 114, and corresponding drain nodes 118b to 118n. The dotted and dashed lines in this figure indicate that there may be additional amplifying transistor cells and program lines added to this circuitry in accordance with the present disclosure, therefore the disclosure should not be limited to these illustrated embodiments.

Figure 7:
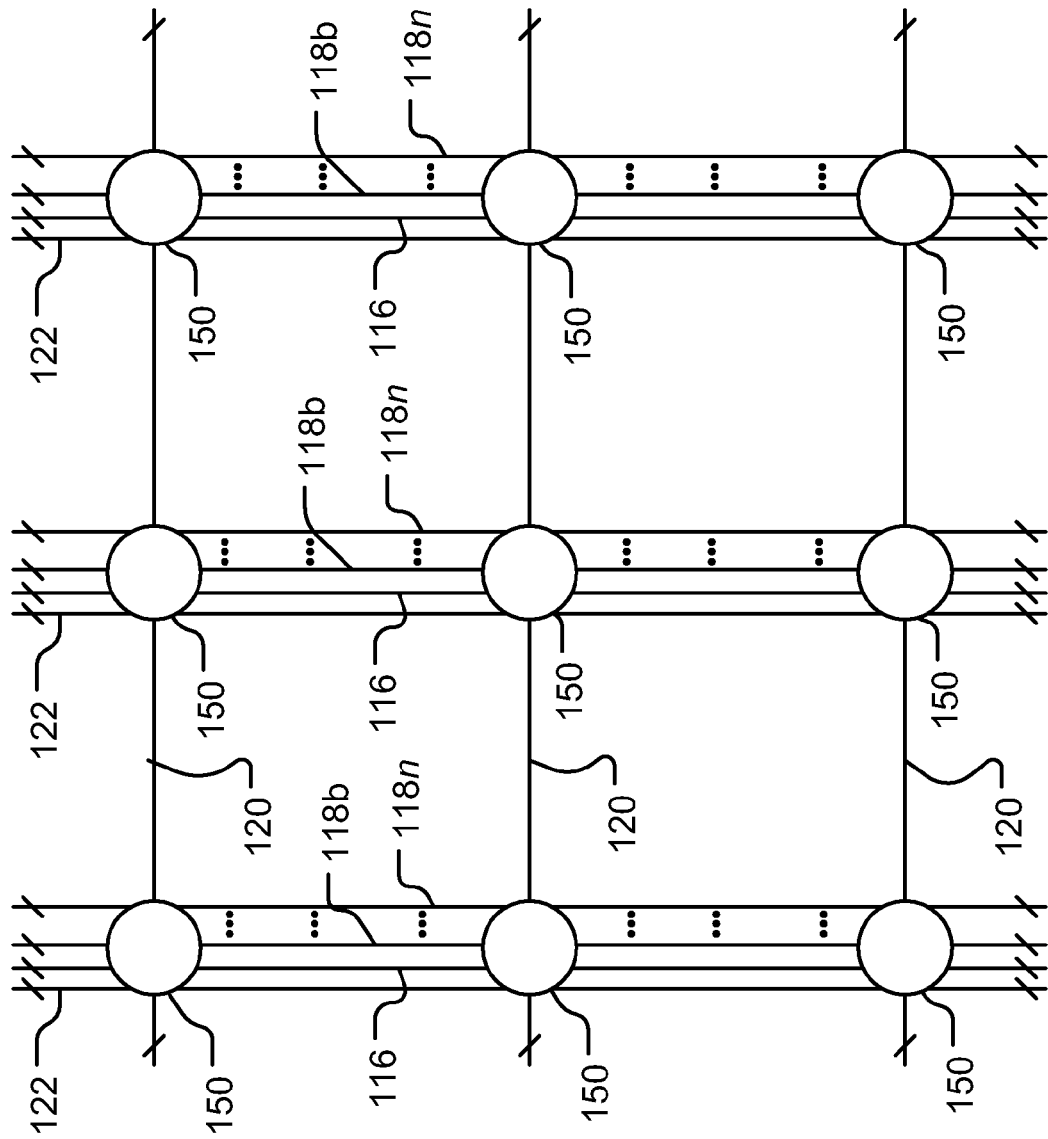
FIG. 7 shows a simplified plan view of a memory array including memory cells such as the example shown in FIG. 6.

FIG. 7 shows a simplified plan view of a memory array including memory cells, such as the example shown in FIG. 6. The memory cells 150 are arranged in rows and columns. Each memory cell 150 of a particular row is connected by a word line 120, while each memory cell 150 of a particular column is connected by a bit line 122, a first program line 116, a second program line 118b, and n−2 additional program lines, where n represents the total number of program lines connected to each cell.

FIG. 8 shows a perspective diagram of an alternative embodiment of an exemplary MRAM cell 850, in which a bit write line 824 is used to write to the cell 850 (as an alternative to writing to the cell by passing a current through PL-A 116 of FIG. 1). Word line (WL) 820 provides a first conductive line electrically connected to the top electrode (302 of FIG. 3) of magnetoresistive element 300. First and second program lines PL-A 816 & PL-B 818 provide conductive lines extending substantially orthogonally to WL 820. Bit line (BL) 822 provides a conductive line, extending parallel to PL-A 816 and PL-B 818. The cell 850 includes a plurality of amplifying transistors 808 and 810, with their respective drain nodes connected to corresponding program lines 816 and 818 (and optionally, additional amplifying transistors and program lines in accordance with the present disclosure). Additionally, the cell 850 includes reference transistor 826, with a gate node connected to bit line 822, and source and drain nodes connected as shown in the figure (in accordance with the selected read scheme previously disclosed). The top electrode (302 in FIG. 3) of the MR element 300 is coupled to WL 820.

The bit write line 824 extends in the vicinity of the MR element 300 for write operations.

During a write operation, electrical current flows through bit write line 824 and a current is passed through WL 820. The magnitude of these currents is selected such that, ideally, the resulting magnetic fields are not strong enough to affect the memory state of other proximate MR elements in the array, yet the combination of the two magnetic fields (at MR element 300) is sufficient for switching the memory state of MR 300 (e.g., switching the magnetic moment of the free layer 304 shown in FIG. 3). In this exemplary embodiment, two read ports have been disclosed. However, in accordance with the principles of the present disclosure, in some embodiments, additional read ports may be added such that n read ports are enabled (similar to the example shown with reference to FIG. 6).

Figure 9B:
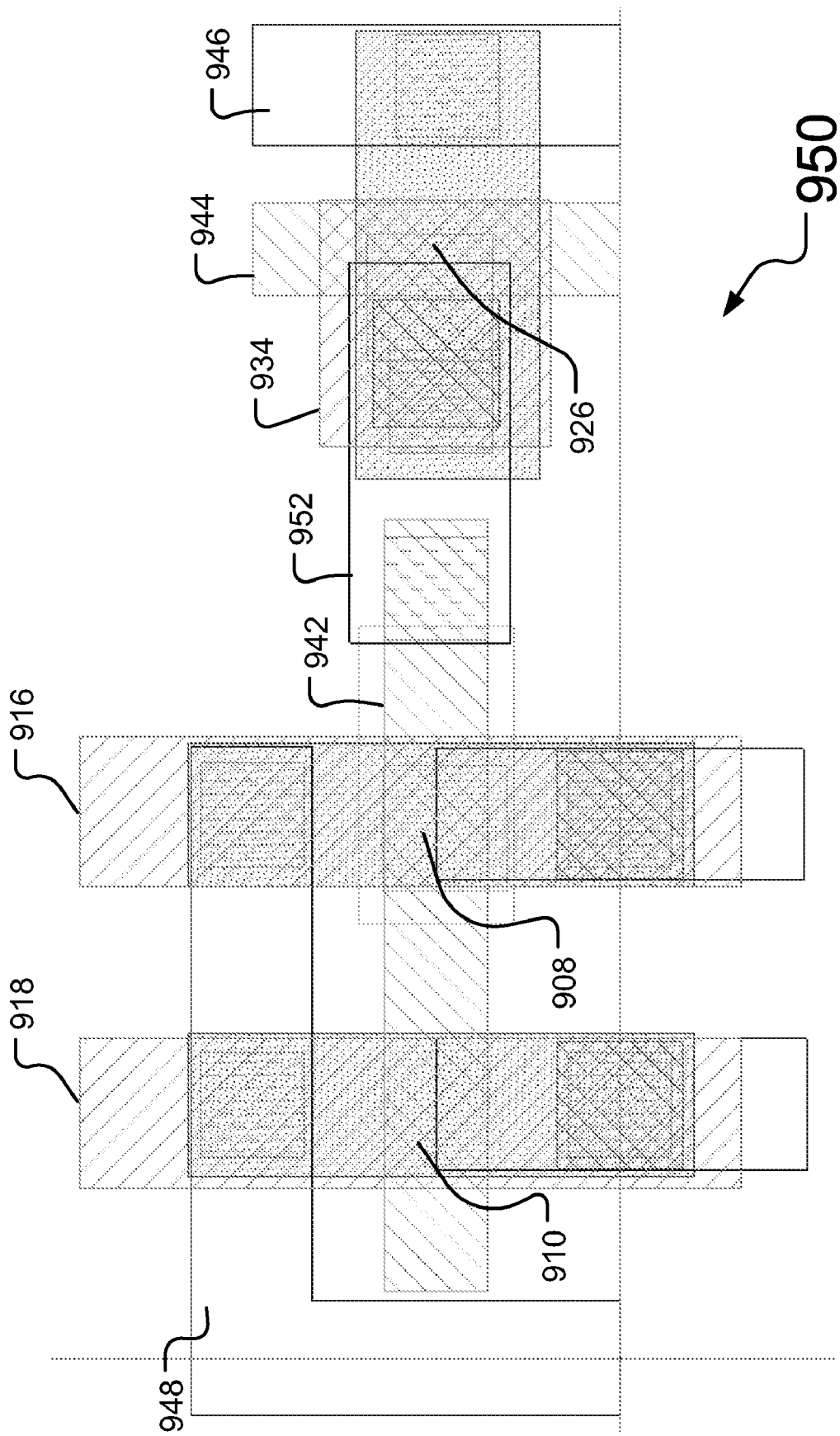

FIGS. 9A and 9B illustrate layout diagrams of another embodiment of an exemplary MRAM cell 950. FIG. 9A shows the MTJ portion of cell 950, and FIG. 9B shows the transistor and read port portions of cell 950. With reference to FIG. 9A, the cell 950 includes a word line 920, a write line 924, a first program line 916, a second program line 918, and an MTJ cell 300. The cell boundary is shown by line 902. Via-x 930 provides a connection from the MTJ 300 bottom electrode 912 to a metal landing pad 934. Via-y 932 provides a connection from the word line 920 to the MTJ 300 top electrode.

Referring now to FIG. 9B, which shows the transistor and read port portions of cell 950, polysilicon 942 provides the gate junction for reference transistor 926, and polysilicon 944 provides the gate junction for first amplifying transistor 908 and second amplifying transistor 910. Metal landing pad 934, which is electrically connected to the bottom electrode of MTJ 300 is also electrically connected to the polysilicon gate junction 944 and the drain of reference transistor 926 via metalized layer 952. Metalized layer 948 connects the source (or alternatively the drain) junctions of first and second amplifying transistors 908, 910. Metalized layer 946 provides an electrical connection to word line 920. Accordingly, The respective layers may be processed using conventional processing techniques that are known in the art.

While various embodiments in accordance with the principles disclosed herein have been described above, it should be understood that they have been presented by way of example only, and not limitation. For instance, the present disclosure can apply to not only MRAM cells, but also other resistive memory cells such as phase-change random access memory (PRAM) cells, resistive cells formed from nanotubes, or the like. Again, it should be noted that MTJ cell 300 is an exemplary type of resistive element for a resistive memory application. For example, other types of resistive elements such as multilayer-GMR (Giant Magnetoresistance Effect), spin-valve GMR and Granular GMR could alternatively be used as a resistive memory cell in accordance with the principles of the present disclosure. It should be noted that while exemplary circuitry and layouts have been presently disclosed, many other equivalent layouts and variations are possible that incorporate the teachings of the present disclosure. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A non-volatile memory cell comprising:
   (a) a resistive type memory element having an electrode layer;
   (b) a plurality of transistors, each transistor having a gate node connected to the electrode layer; and
   (c) a reference transistor comprising a drain node and a source node, wherein one of the drain and the source nodes is connected to the electrode layer.

2. A non-volatile memory cell according to claim 1, wherein the resistive type memory comprises a magnetoresistive memory device.

3. A non-volatile memory cell according to claim 1, wherein the plurality of transistors each further comprise a drain node, wherein the drain nodes of the plurality of transistors are connected to a predetermined voltage node.

4. A non-volatile memory cell according to claim 3, further comprising a plurality of ports, wherein the plurality of transistors each further comprise a source node, and wherein the source node of each of the plurality of transistors is connected to a corresponding one of the plurality of ports.

5. A non-volatile memory cell according to claim 4, wherein the plurality of transistors each further comprise a source node, wherein the source nodes of the plurality of transistors are connected to a signal ground node.

6. A non-volatile memory cell according to claim 5, further comprising a plurality of ports, wherein the plurality of transistors each further comprise a drain node, and wherein the drain node of each of the plurality of transistors is connected to a corresponding one of the plurality of ports.

7. A non-volatile memory cell comprising:
   (a) a resistive type memory element comprising:
      (i) a first electrode conductor,
      (ii) a second electrode conductor, and
      (iii) a resistive memory device between the first and second electrode conductors;
   (b) a first conductive line electrically connected to the first electrode conductor;
   (c) a first transistor and a second transistor, each transistor comprising a gate node, a source node, and a drain node, wherein the gate nodes of each transistor are electrically connected to the second electrode conductor; and (d) a second conductive line and a third conductive line,
wherein the second conductive line is electrically connected to one of the drain node and the source node of the first transistor, and
wherein the third conductive line is electrically connected to one of the drain node and the source node of the second transistor.

8. A non-volatile memory cell according to claim 7, wherein the resistive memory device comprises a magnetoresistive memory device.

9. A non-volatile memory cell according to claim 7, wherein the first conductive line is substantially orthogonal to the second and the third conductive lines.

10. A non-volatile memory cell according to claim 7, wherein the second conductive line is electrically connected to the drain node of the first transistor, and the source node of the first transistor is electrically connected to the source node of the second transistor.

11. A non-volatile memory cell according to claim 7, wherein the second conductive line is electrically connected to the source node of the first transistor, and the drain node of the first transistor is electrically connected to the drain node of the second transistor.

12. A non-volatile memory cell according to claim 7, further comprising a bit line substantially orthogonal to a word line.

13. A non-volatile memory cell according to claim 7, wherein the first conductive line is a word line.

14. A non-volatile memory cell according to claim 7, wherein the second conductive line is a first program line and the third conductive line is a second program line.

15. A non-volatile memory cell according to claim 14, wherein the first program line is a write bit line and a read line.

* * * * *